United States Patent
Lee et al.

(10) Patent No.: US 7,413,845 B2
(45) Date of Patent: Aug. 19, 2008

(54) ELIMINATION OF WRITE HEAD PLATING DEFECTS USING HIGH ACTIVATION CHEMICALLY AMPLIFIED RESIST

(75) Inventors: Kim Y. Lee, Fremont, CA (US); Dennis Richard McKean, Milpitas, CA (US)

(73) Assignee: Hitachi Global Storage Technologies Netherlands B.V. (NL)

( * ) Notice: Subject to any disclaimer, the term of this patent is extended or adjusted under 35 U.S.C. 154(b) by 562 days.

(21) Appl. No.: 10/831,412

(22) Filed: Apr. 23, 2004

(65) Prior Publication Data

US 2005/0239001 A1   Oct. 27, 2005

(51) Int. Cl.
*G03F 7/00* (2006.01)

(52) U.S. Cl. .................. 430/313; 315/319; 315/320; 315/330

(58) Field of Classification Search .................. 430/315, 430/319, 313, 330, 320
See application file for complete search history.

(56) References Cited

U.S. PATENT DOCUMENTS

| | | | |
|---|---|---|---|
| 5,582,927 A * | 12/1996 | Andricacos et al. ......... 428/812 |
| 5,843,521 A | 12/1998 | Ju et al. |
| 5,955,244 A | 9/1999 | Duval |
| 6,037,107 A | 3/2000 | Thackeray et al. |
| 6,091,582 A | 7/2000 | Komuro et al. |
| 6,120,918 A | 9/2000 | Osaka et al. |
| 6,358,674 B1 | 3/2002 | Kamijima et al. |
| 6,407,892 B2 | 6/2002 | Shiroishi |
| 6,483,663 B2 | 11/2002 | Okada et al. |
| 6,530,141 B2 | 3/2003 | Komuro et al. |
| 6,540,928 B1 | 4/2003 | Kobrin et al. |
| 6,547,975 B1 | 4/2003 | Kobrin |
| 6,553,649 B1 | 4/2003 | Santini |
| 6,562,487 B1 | 5/2003 | Vas'ko et al. |
| 6,612,017 B2 | 9/2003 | Santini |
| 6,635,408 B2 * | 10/2003 | Kamijima ................... 430/313 |
| 6,641,984 B2 | 11/2003 | Kamijima |
| 6,693,769 B2 | 2/2004 | Hsu et al. |
| 6,694,604 B2 | 2/2004 | Santini |
| 2001/0035343 A1 | 11/2001 | Kamijima |
| 2002/0191351 A1 | 12/2002 | Santini |
| 2003/0059722 A1 | 3/2003 | Kamijima |
| 2003/0137778 A1 | 7/2003 | Kasahara et al. |

FOREIGN PATENT DOCUMENTS

JP    2001110013    4/2001

FOREIGN PATENT DOCUMENTS

JP    2003177549    6/2003

OTHER PUBLICATIONS

Rohm and Haas Electronic Materials LLC (2004), *UV26 Positive DUV Photoresist (0.2-3.8)* (Material Safety Data Sheet), Version 2.0, pp. 1-9.

* cited by examiner

*Primary Examiner*—Mark F. Huff
*Assistant Examiner*—Caleen O Sullivan
(74) *Attorney, Agent, or Firm*—Mintz, Levin, Cohn, Ferris, Glovsky & Popeo P.C.

(57) ABSTRACT

Methods of forming a component of a thin film magnetic head and improving the plating of a component of a thin film magnetic head are provided. The methods include the use of a high activation energy chemically amplified photoresist (CARS) that is contacted with a low pH high saturation magnetic moment plating solution to form a magnetic head component that is essentially free of plating defects. The methods find utility in hard disk drive applications, such as in the manufacture of magnetic poles for the write head of a hard disk drive.

30 Claims, 3 Drawing Sheets

ELIMINATION OF WRITE HEAD PLATING DEFECTS USING HIGH ACTIVATION CHEMICALLY AMPLIFIED RESIST

FIELD OF THE INVENTION

This invention relates to an improved method for making certain components for magnetic storage hard disc drives. More particularly, the invention relates to the reduction or elimination of plating defects in components of a magnetic head, such as in a write head of a thin film magnetic head for use in hard disk drives.

BACKGROUND OF THE INVENTION

The need for increased storage capacity and improved read and write access to information stored on magnetic disk drives has produced a large number of improvements in hard disk drive technology. The general trend has been toward increased areal density of information stored on magnetic disk drives, accomplished in part by improvements in the magnetic storage characteristics of materials used to store magnetic information on hard disks and by improved designs and methods of making read and write heads for hard disks. In a thin film write (recording) head, for example, such improvements have resulted in reductions in the width of the pole tips of the write heads in order to increase the track density of the recording medium to which the head writes information. Since higher track densities resulting from narrower pole tip widths allow for more information to be stored on a hard disk, the need to provide further improvements by reducing track width presents a continuing challenge.

Write heads for hard disk drives also desirably benefit from the use of high magnetic fields for writing information on a hard disk. In order for a high magnetic field to be provided by a write head, the magnetic flux density needs to be high in the write head. In turn, higher saturation magnetic moments for write heads are necessary to provide higher flux densities so that areal densities of the magnetic media may thereby also be increased. Materials with high saturation magnetic moments allow for the generation of higher magnetic fields in the magnetic media, increased field gradients, faster effective rise times, narrower pulse widths, smaller erase bands and improved over-write characteristics on the magnetic media. For this reason, it is desirable that the pole tips of a thin film magnetic write head be formed from a high saturation magnetic moment material.

The fabrication of a thin film magnetic head, as well as the various components of the magnetic head, requires that certain submicrometer structures be formed. An example of such a structure is the pole tip of a write head. One method of making pole structures is to fabricate a mask using a photoresist according to a frame plating method in conjunction with a plating process. A typical general sequence for frame plating a pole structure includes depositing a seedlayer on a wafer, spin coating a layer of photoresist on the wafer, imagewise patterning of the photoresist through a mask to expose areas of the photoresist intended to be removed (for a positive-tone resist, or areas intended to be not removed for a negative-tone resist), removal of areas intended to be removed by developing the photoresist to thereby provide a framed opening in the photoresist corresponding to a pole structure, and plating the framed opening to form the pole structure by a conventional plating process.

Resist frame plating methods are also described in the literature. In U.S. Pat. No. 6,547,975 (to Kobrin), for example, a magnetic pole fabrication process is described in which a seedlayer material is sputtered onto the vertical sidewall portion of a polymer layer used to form a submicrometer structure. A "resist frame for plating" method is also referred to in Kobrin based on the disclosure of U.S. Pat. No. 5,665, 251.

In U.S. Pat. Nos. 6,635,408 and 6,641,984 and U.S. Patent Application Publication No. 2001/0035343 (all to Kamijima) and U.S. Pat. No. 6,358,674 (to Kamijima et al.), frame plating methods are also described using a resist that may be a chemically amplified resist. The resist is described as being coated with a covering layer of a water-soluble crosslinking agent capable of being crosslinked in the presence of acid and a resin material containing at least a water-soluble resin on the water-soluble crosslinking agent. The covering layer, rather than the resist, appears to be described as functioning as the frame in contact with the plating solution.

As is known in the art, chemically amplified resists (CARS) may be categorized as positive-tone or negative-tone resists. Positive-tone resists generally contain two major components: an aqueous base soluble polymer resin and a photoacid generator (PAG). The aqueous base soluble polymer of such chemically amplified resists typically contains polar functional groups protected by acid-cleavable protecting groups (also known in the art as acid labile, or blocking groups). The presence of such protecting groups converts the aqueous base soluble polymer into an insoluble resin. Acid catalyzed deprotection of the protected sites converts the polymer back into an aqueous base soluble polymer. Development of the positive-tone resist selectively removes the exposed regions of the photoresist.

The acid-cleavable groups used with the aqueous base soluble polymer resins can be classified into two distinct groups: a) high activation energy protecting groups such as t-butyl ester or t-butyl carbonyl groups; and b) low activation energy protecting groups such as acetal, ketal or silylether groups. Hybrid resists are also described in the art in which a combination of high and low activation energy groups is included in the resist (see, e.g., U.S. Pat. No. 6,303,263 to Chen et al.).

Although a wide variety of photoresists are known in the art, the requirements of a specific application may govern the suitability of using a particular resist in that application. For example, in contacting a resist frame with certain plating process solutions, defects such as cracks and "worms" (i.e., localized fractures or irregular defects in the resist) may be introduced into the resist depending on the type of resist, the plating solution and/or the plating conditions used. Such defects, in turn, may lead to irregularities and defects in the plated structures obtained from the plating process.

Thus it is desirable to have a method for making plated components for hard disk drive magnetic heads, particularly the write head poles of a magnetic head, which are essentially free of plating defects. It is further desirable for such a method to provide a means for reducing or eliminating such defects through compatible modifications to existing methods for making plated components for magnetic heads.

Accordingly, the present invention addresses such needs in part by providing an improved method of forming a component of a magnetic head, that, in one embodiment, is suitable for making a plated magnetic component of a write head for use in a hard disk drive.

SUMMARY OF THE INVENTION

It is a general object of the invention to provide a method of forming a component of a thin film magnetic head, a method of improving the plating of a component of a thin film magnetic head, and a frame plating method, whereby a plated component is formed that is essentially free of plating defects.

One aspect of the invention therefore relates to a method of forming a component of a thin film magnetic head, wherein the magnetic head is formed from a structure that includes a substrate layer, a seedlayer deposited on the substrate layer, and a photoresist composition layer deposited on the seedlayer, comprising:

provide a high activation energy chemically amplified photoresist composition as said photoresist composition layer;

patternwise exposing said photoresist composition layer to an imaging radiation source to form a latent, patterned image in the photoresist composition layer;

developing the latent image in the photoresist composition layer with a developer to form a patterned photoresist; and, performing a plating process to form the thin film magnetic head component by directly contacting the patterned photoresist with a plating process solution having a pH of less than about 3.0, wherein the plated thin film magnetic head component is essentially free of plating defects.

Another aspect of the invention pertains to a method of improving the plating of a component of a thin film magnetic head, comprising forming a frame plating patterned photoresist layer from a layer of a high activation energy chemically amplified photoresist composition coated on a substrate layer, and directly contacting the patterned photoresist layer with a plating process solution having a pH of less than about 3.0, wherein the plated thin film magnetic head component is essentially free of plating defects.

A further aspect of the invention concerns an improvement in a method of plating a component of a thin film magnetic head, wherein a photoresist composition is layered on a substrate layer, formed into a patterned photoresist composition layer and contacted with a plating process solution having a pH of less than about 3.0 in order to form a component of the thin film magnetic head, the improvement comprising employing a high activation energy chemically amplified photoresist composition as said photoresist composition such that the plated thin film magnetic head component is essentially free of plating defects arising from contact of the photoresist composition layer with the plating process solution.

Yet another aspect of the inventions relates to a frame plating method, comprising:

forming a pattern in a photoresist composition comprising a high activation energy chemically amplified photoresist, or in a layer of said photoresist composition formed on a substrate, by patternwise exposing said photoresist composition to an imaging radiation source to form a latent, patterned image in the photoresist composition;

developing the latent image in the photoresist composition with a developer to form a patterned photoresist;

performing a plating process using the patterned photoresist as a frame by directly contacting the patterned photoresist with a plating process solution having a pH of less than about 3.0, and, removing the patterned photoresist.

Additional aspects, advantages and novel features of the invention will be set forth in part in the figures and detailed description that follow, and will become apparent to those skilled in the art upon examination of the following, or may be learned by practice of the invention through routine experimentation.

DETAILED DESCRIPTION OF THE INVENTION

Definitions and Overview

Figure 1:
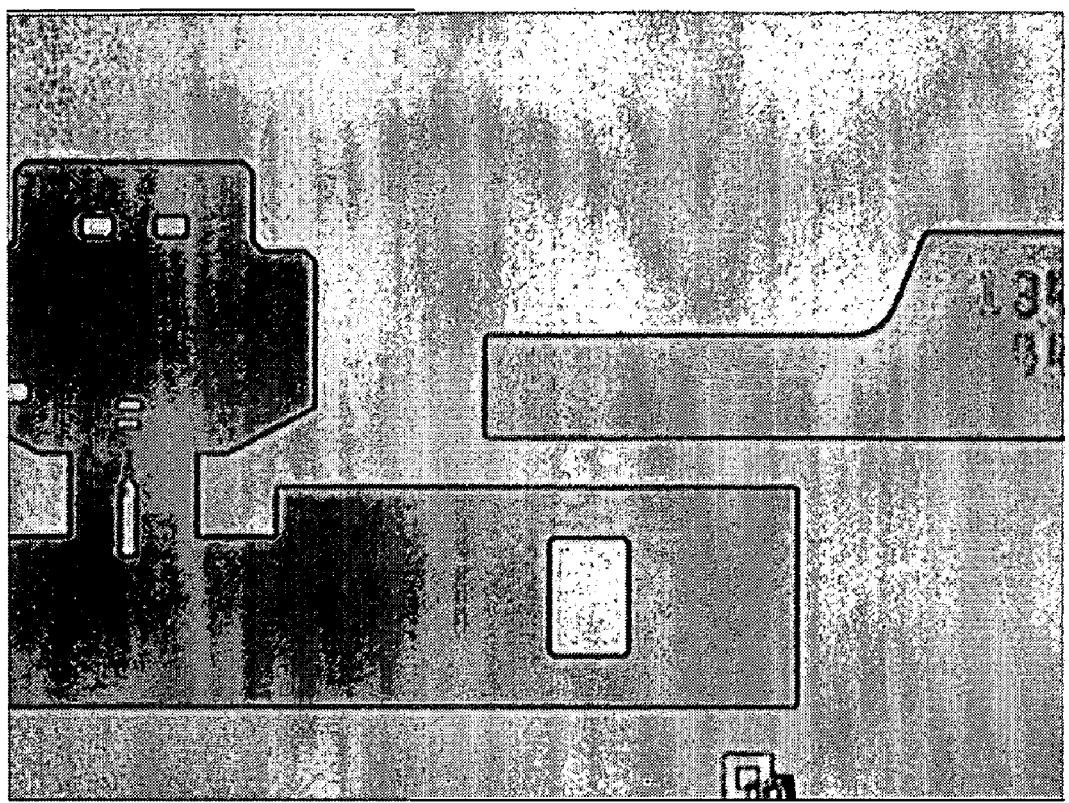
FIG. 1 shows a plated high activation energy CARS (Shipley UV26®) plated with 22/78 NiFe plating as described in Example 1.

The definitions set forth herein apply only to the terms as they are used in this patent and may not be applicable to the same terms as used elsewhere, for example in scientific literature or other patents or applications including other applications by these inventors or assigned to common owners. The following description of embodiments and examples are provided by way of explanation and illustration. As such, they are not to be viewed as limiting the scope of the invention as defined by the claims. Additionally, when examples are provided, they are intended to be exemplary only and not to be restrictive. As well, when an example is said to "include" a specific feature, it is intended to imply that it may have that feature but not that such examples are limited to those that include such features.

As used in this specification and in the appended claims, the singular forms "a", "an" and "the" include plural referents unless the context clearly dictates otherwise. Similarly, the phrase "a combination thereof" includes mixtures of one or more of the same category of referent, as well as mixtures of different referents. More particularly, the combination of acid-cleavable substituent groups for an aqueous base soluble polymer is intended to include mixtures of one or more acid-cleavable substituent groups with one or more aqueous base soluble polymers, in addition to a mixture of one polymer having an acid-cleavable substituent group with one or more other polymers having the same or different acid-cleavable substituent group(s). The same understanding also applies for other combinations; in particular, for the aqueous base soluble polymers having polar functional groups.

In describing and claiming the present invention, the following terminology is used in accordance with the definitions set out below.

The term "high activation energy" refers to chemically activated resists having protecting groups that require a comparatively high activation energy in order to deprotect the blocking groups in the resist. In this sense, the term "high" is intended to be descriptive of a known class of chemically activated resists rather than indicative of a particular degree or quantity of activation energy required. As a class of resists, high activation energy resists are distinguished from low activation energy and hybrid resists since they are not activated at room or low to moderate temperatures. Typically, temperatures of about 70° C. or above are required to activate such high activation energy resists.

Similarly, the term "high saturation magnetic moment" refers to plating materials having a comparatively high magnetic moment. Here, the term "high" is also intended to be descriptive of a class of magnetic materials rather than indicative of a particular degree of saturation magnetic moment. Typically, however, such materials have saturation magnetic moments above about 2.3 T.

The term "activation temperature," as used in reference to chemically amplified photoresists (CARS), refers to the temperature at which a chemical amplification reaction occurs due to the temperature induced, acid-catalyzed deprotection of acid-cleavable (blocking) groups in the resist resin.

The phrase "essentially free of plating defects" is generally intended to mean that most or all plating defects that arise due to contacting a photoresist with a plating solution are eliminated. Minor defects not adversely affecting the performance of the plated component, such as a write head of a thin film magnetic head for use in hard disk drive applications, may still remain.

By the term "directly contacted," as used in reference to the plating of the patterned photoresist using the plating solution, it is intended that the photoresist is not further treated, such as by coating or sputtering an additional layer of a material onto the photoresist, prior to contacting the photoresist with the plating solution. In this sense, the photoresist itself is contacted with the plating solution rather than a surface treated or coated photoresist being contacted with the plating solution. The "directly contacted" patterned photoresist of the present invention may be distinguished in part from processes described in the literature, such as the Kamijima and Kamijima et al. patents mentioned above, since coatings and surface treatments of the photoresist are not used.

The term "acid-cleavable" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to resist polymers in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist compositions to radiation, by virtue of the photoacid generator contained in the compositions.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroatom.

For additional information concerning terms used in the field of lithography and lithographic compositions, see *Introduction to Microlithography*, Eds. Thompson et al. (Washington, D.C.: American Chemical Society, 1994).

High Activation Energy Chemically Amplified Photoresist

High activation energy chemically amplified photoresists suitable for use in the present invention are generally known in the art, and are available from various manufacturers. Such resists generally contain an aqueous base soluble polymer resin having acid-cleavable substituent groups selected from acid-cleavable cyclic and branched aliphatic carbonyls, ester, oligomeric ester, ether, carbonate, orthoester, and combinations thereof. Although negative-tone resists may in principle be utilized, the high activation energy chemically amplified photoresist is preferably a positive-tone photoresist.

The aqueous base soluble polymer resins employed in the present invention are generally well known to those skilled in the resist material art. Suitable aqueous base soluble polymer resins employed include homopolymers containing one monomeric repeating unit or higher polymers, i.e. copolymers, terpolymers, etc., containing two or more monomeric repeating units that are soluble in an alkaline solution. The polymer may also be formed from a mixture of two or more different first monomers and may further include at least one additional olefinic comonomer, e.g., thereby forming ter-, tetra- or multi-monomer polymers. While not strictly limited, such additional monomers include monomers containing an acid-cleavable substituent, monomers containing an acid-inert, polar substituent, monomers containing an acid-inert, nonpolar substituent, and combinations thereof.

The aqueous soluble base polymer resins employed in the present invention are those that contain polar functional groups that readily ionize. Generally such groups are hydroxyl or carboxyl functionalities, although other polar functional groups, such as anhydride, lactone, imide, fluoroalcohol, sulfonamide, and combinations thereof may also be used.

Illustrative examples of suitable homopolymers that can be utilized in the present invention include, but are not limited to: phenolic-containing resins such as poly(hydroxystyrene) including the para-, meta-, and ortho-substituted forms and phenol formaldehydes; polymers having an acid or an anhydride group, e.g. polyacrylic acid or polymethacrylic acid; or acrylamide, imide or hydroxyimide group polymers. Preferred homopolymers generally have a weight average molecular weight within the range of about 1000 to about 250,000, and preferably within the range of about 2000 to about 25,000.

Examples of suitable higher polymer resins that can be employed in the present invention are those which contain at least two of the following monomers: styrene, hydroxystyrene, acrylic acid, methacrylic acid, acrylate, methacrylate, vinylcyclohexanol, phenol formaldehyde, acrylamide, maleic anhydride, and maleimide. The molecular weight for such higher polymer resins employed in the present invention is generally in the same ranges noted previously for the homopolymers. A preferred higher polymer employed in the present invention is one which contains at least two of the following monomeric units: styrene, hydroxystyrene, acrylic acid, methacrylic acid, vinylcyclohexanol, acrylate, and methacrylate.

The aqueous base soluble polymer resins employed in the present invention also contain a polymeric backbone such as, but not limited to: polyolefins, polyolefin sulfones, polysulfones, polyketones, polycyclic olefins, polycarbonates, polyimides, polyethers and the like.

The acid-cleavable substituent (protecting) groups are desirably selected such that the high activation energy chemically amplified photoresist has an activation temperature of at least about 70° C., preferably at least about 90° C., more preferably at least about 120° C. In addition, the photoresist polymer should be stable in low pH plating solutions, preferably such that defects do not occur in the photoresist and plated components arising from contact of the photoresist with the plating solution. As noted, representative such groups include acid-cleavable cyclic and branched aliphatic carbonyls, ester, oligomeric ester, ether, carbonate and orthoester groups.

Illustrative examples of cyclic or branched aliphatic carbonyls that may be employed in the present invention include, but are not limited to: phenolic carbonates; t-alkoxycarbonyloxys such as t-butoxylcarbonyloxy; and isopropyloxycarbonyloxy. A preferred carbonate that may be employed in the present invention is t-butoxylcarbonyloxy.

Examples of cyclic and branched ethers that may be employed in the present invention include, but are not limited to: benzyl ether and t-alkyl ethers, such as t-butyl ether. Of the ethers, t-butyl ether is preferred.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-.gamma.-butyrolactonyl ester, 3-methyl-.gamma.-butyrolactonyl ester, bis(trimethylsilyl)isopropyl ester, trimethylsilylethyl ester, tris(trimethylsilyl)silylethyl ester and cumyl ester.

In another aspect, the polymer resin may contain at least one acid-inert, non-polar substituent. Exemplary such groups, without limitation, may be selected from $C_1$-$C_{18}$ hydrocarbyl and substituted $C_1$-$C_{18}$ hydrocarbyl, e.g., fluorinated $C_1$-$C_{18}$ hydrocarbyl. Suitable acid-inert moieties include, for example, $C_1$-$C_{18}$ alkyl, $C_1$-$C_{18}$ hydroxyalkyl, fluorinated $C_1$-$C_{18}$ alkyl, and fluorinated $C_1$-$C_{18}$ hydroxyalkyl.

Photoresist Compositions

The high activation energy photoresist is generally used in the form of a photoresist composition that comprises the photoresist polymer, as described in detail above, and a photoacid generator, with the polymer representing up to about 99 wt. % of the solids included in the composition, and the photoacid generator representing approximately 0.1 to 25 wt. % of the solids contained in the composition. Other components and additives may also be present, e.g., dissolution modifying additives such as dissolution inhibitors.

The photoacid generator may be any compound that, upon exposure to radiation, generates a strong acid and is compatible with the other components of the photoresist composition. Such compounds are commonly employed herein as well as in the prior art for the deprotection of the acid-cleavable protecting groups. Examples of preferred photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., stable to at least 140° C., so they are not degraded during pre-exposure processing.

The specific photoacid generator selected will depend on the irradiation source being used for patterning the resist. Photoacid generators are currently available for a variety of different wavelengths of light from the visible range to the X-ray range; thus, imaging of the resist can be performed using mid-UV, deep-UV, extreme-UV, e-beam, X-ray or any other irradiation source deemed useful.

Any suitable photoacid generator can be used in the photoresist compositions of the invention. Typical photoacid generators include, without limitation:

sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

trifluoromethanesulfonate esters of imides and hydroxyimides, e.g., α-(trifluoromethylsulfonyloxy)-bicyclo[2.2.1] hept-5-ene-2,3-dicarboximide (MDT);

nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

sulfonyloxynaphthalimides such as N-camphorsulfonyloxynaphthalimide and N-pentafluorophenylsulfonyloxynaphthalimide;

pyrogallol derivatives (e.g., trimesylate of pyrogallol);

naphthoquinone-4-diazides;

alkyl disulfones;

s-triazine derivatives, as described in U.S. Pat. No. 4,189,323; and miscellaneous sulfonic acid generators including t-butylphenyl-α-(p-toluene-sulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

A dissolution modifying additive, generally although not necessarily a dissolution inhibitor, is typically included. If a dissolution inhibitor is present, it will typically represent in the range of about 1 wt. % to 40 wt. %, preferably about 5 wt. % to 30 wt. %, of the total solids.

Preferred dissolution inhibitors have high solubility in the resist composition and in the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater). Suitable dissolution inhibitors include, but are not limited to, bisphenol A derivatives, e.g., wherein one or both hydroxyl moieties are converted to a t-butoxy substituent or a derivative thereof such as a t-butoxycarbonyl or t-butoxycarbonylmethyl group; fluorinated bisphenol A derivatives such as $CF_3$-bisphenol A-$OCH_2(CO)$—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with one to three $C_1$-$C_4$ fluoroalkyl carbonyloxy substituents, such as t-butyl trifluoroacetyllithocholate (see, e.g., U.S. Pat. No. 5,580,694 to Allen et al.).

The remainder of the resist composition is composed of a solvent and may additionally, if necessary or desirable, include customary additives such as dyes, sensitizers, additives used as stabilizers, dissolution modifying additives, and acid-diffusion controlling agents, basic compounds, coating aids such as surfactants or anti-foaming agents, crosslinking agents, photospeed control agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. In addition to the above components, the photoresist compositions provided herein generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist composition is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, including a wide variety of ionic and non-ionic, monomeric, oligomeric, and polymeric species. Likewise, various antifoaming agents may be employed to suppress coating defects, adhesion promoters, and monomeric, oligomeric, and polymeric plasticizers such as oligo- and polyethyleneglycol ethers, cycloaliphatic esters, and non-acid reactive steroidally derived materials may be used, if desired. However, neither the classes of compounds nor the specific compounds mentioned above are intended to be comprehensive and/or limiting. The skilled artisan will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

The photoresist compositions of the invention may also contain polymers selected to provide or increase certain properties, such as transparency at a predetermined, desired wavelength, increase dry etch resistance, and/or improve aqueous base development. Representative such polymers are disclosed in the patent literature. Polymers that are non-fluorine-containing or fluorine-containing may be used.

Plating Process Solution

The plating process solutions useful in the invention are comprised of one or more high saturation magnetic moment materials. In general, such materials are metal compounds or alloys wherein the high saturation magnetic moment plating material has a saturation magnetic moment of at least about 2.3 T, preferably at least about 2.4 T, and more preferably at least about 2.5 T. Representative such materials include, without limitation, NiFe, CoFeNi and CoFe alloys, although other materials may also be used. Preferred materials include CoFe and CoFeNi with an Fe content greater than about 60% having a magnetic moment in the range of about 2.4 T to 2.45 T. CoFeNi materials are noted as being generally more robust against corrosion but require low pH plating baths having a pH of about 1.85 or less.

In general, the plating solution has a relatively low pH due to the solubility requirements of the metal compounds in the plating solution. Typically, the plating solution comprising the high saturation magnetic moment material has a pH of less than about 3.0, preferably less than about 2.5, and more preferably less than 1.85, depending of the plating material. A variety of components may be present in the plating solution, including metal compounds such as metal salts (e.g. sulfates such as cobalt sulfate, nickel sulfate, and ferrous sulfate), stabilizers, reducing agents, complexing agents, buffers, accelerators, surfactants etc. Additives such as saccharin sodium may also be included for stress relaxation to prevent peeling off of a plated film.

The amounts and concentrations of the various components of the plating solution may be within ranges generally utilized in the art. Metal compounds such as cobalt sulfate, nickel sulfate, and ferrous sulfate, for example, are typically present in amounts ranging from 0 to about 100 g/liter.

Methods of Use

Various methods for making components of magnetic heads such as write heads for thin film magnetic heads have been described in the art. In U.S. Pat. No. 6,693,769 to Hsu et al., for example, a general frame plating technique for making a magnetic pole tip of a write head is mentioned. In the method, a photoresist is employed to provide the frame while a seedlayer is used to provide a return path for the plating operation. The sequence of steps mentioned at column 2, line 6 et seq., includes: sputter cleaning of a wafer, sputter depositing of a seedlayer on the wafer, spinning of a photoresist layer on the wafer, light-imaging of the photoresist layer through a mask to expose areas of the photoresist that are to be removed, developing the photoresist to remove the light-exposed areas to provide an opening in the photoresist at the pole tip region, and plating the pole tip in the opening up to a desired height.

The present invention may be applied to such methods of making magnetic head components, particularly write heads for hard disk drive applications. For example, in one embodiment, the plating process is a frame plating process used in making a magnetic pole of a write head of a hard disk drive. A high activation energy chemically amplified photoresist as described above is used as the resist material for forming the frame. Plating of the magnetic pole, or other magnetic head component structures, using a high saturation magnetic moment material having a low pH (e.g., less than about 3.0), also as described herein, is then performed, resulting in a plated structure that is essentially free of plating defects.

Suitable substrate and seedlayer materials are generally known in the art. For example, substrates may be formed from non-magnetic ceramic materials, including but not limited to oxides, nitrides, carbides, borides and mixtures of oxides, nitrides, carbides and borides. Aluminum oxide-titanium carbide non-magnetic ceramic materials may be used. The substrate is desirably formed with appropriate dimensions such that the substrate may be fabricated into a slider employed within a magnetic data storage device such as a hard disk drive. Seedlayer materials include, for example, copper or aluminum containing materials and conductive magnetic seed materials such as permalloy magnetic materials and other conventional materials. The seedlayer may also be desirably formed from Rh, NiFe, CoFe, CoFeN and Au seedlayer materials. Methods for forming the seedlayer include without limitation any of several known in the art, such as plating deposition methods, chemical vapor deposition methods, physical vapor deposition methods and sputtering methods.

The method may further comprise a post-exposure bake at a temperature of at least about 70° C., preferably at least about 70° C., and more preferably at least about 120° C. Such post-exposure bake conditions may be utilized, for example, to activate the deprotection of a high activation energy CARS.

While the process of the present invention has been described in terms of a microfabrication technique for forming plated components of thin film magnetic heads, it may also be generally applied to the formation of other submicrometer structures. For example, the process of the present invention may also be utilized to form micro-electro-mechanical systems ("MEMS") in which plated MEMS components are essentially free of plating defects, particularly those defects arising from contact of a resist with a low pH plating solution. Other adaptations and uses will be evident to the skilled artisan or may be determined through practice of the invention.

EXAMPLES

The following examples are included so as to provide those of ordinary skill in the art with a complete disclosure and description of how to make and use the compositions and methods of the invention. Efforts have been made to ensure accuracy with respect to numbers (e.g., amounts, temperature, etc.) but some experimental error and deviations should, of course, be allowed for. Unless indicated otherwise, proportions are percent by weight, temperature is measured in degrees centigrade and pressure is at or near atmospheric. All components were obtained from commercially-available sources unless otherwise indicated.

Example 1

22/78 NiFe Plating High Activation Energy Cars

A high activation energy CARS (Shipley UV26®, an acrylic polymer resist) was contacted with a 22/78 NiFe plating bath with a pH value of 2.5. The seedlayer was CoFeN and the plating was preceded by a 2 minutes hydrogen-based plasma ashing. The resist thickness was 3.5 µm and the post plating NiFe thickness was 3 µm.

FIG. 1 is a micrograph of the plated structures for this example with the UV26® resist intact. As shown in FIG. 1, the plated UV26® resist was free of defects such as cracks and "worms."

Example 2

NiFe Plating with Low Activation Energy Resist

A low activation energy CARS (KRS-Xe® from JSR) was contacted with a 22/78 NiFe plating bath having a pH value of 2.5. The seedlayer was CoFeN and the plating was preceded by a 2 minutes hydrogen-based plasma ashing. The resist thickness was 3.5 µm and the post plating NiFe thickness was 3 µm.

Figure 2A:
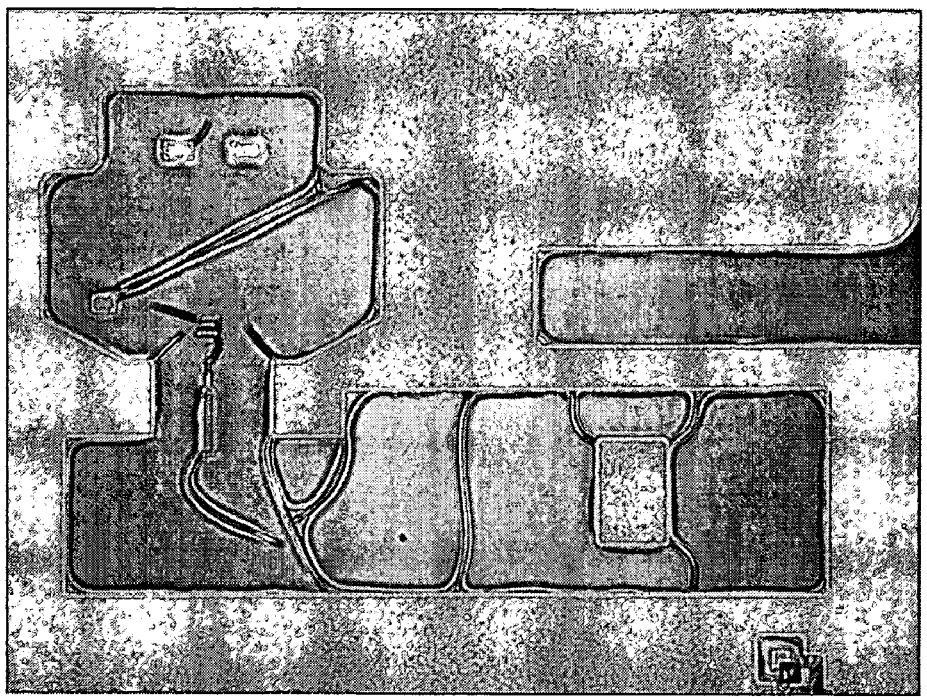
FIGS. 2A and 2B, collectively referred to as FIG. 2, show fractures in KRS-Xe® resist (a low activation energy resist) after immersion in a 22/78 NiFe plating bath as described in Example 2.
Figure 2B:
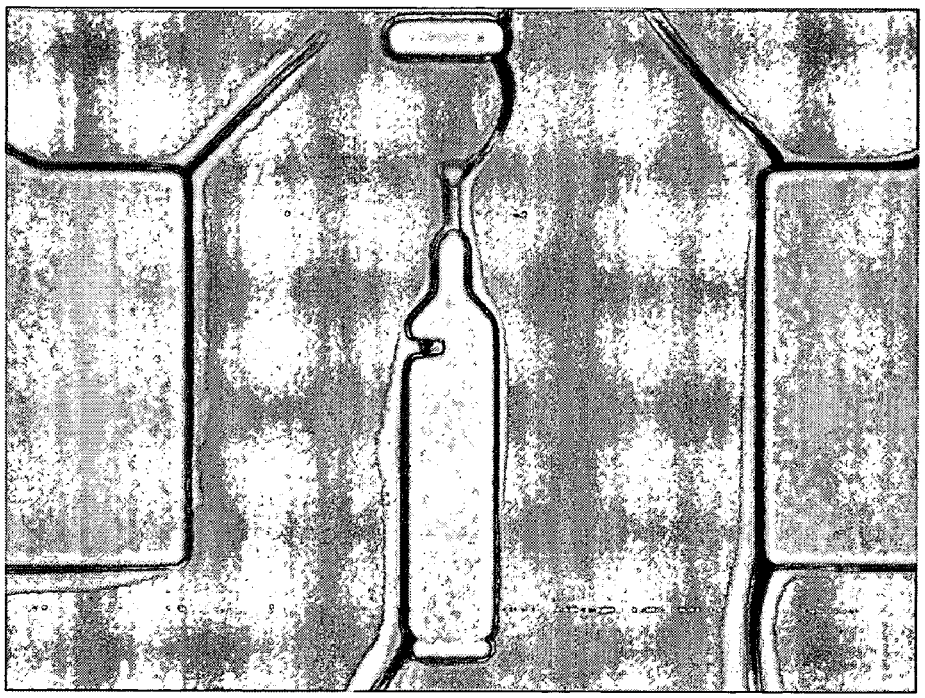

As shown in FIG. 2A and FIG. 2B, the plated KRS resist contained defects such as cracks and "worms." Similar results were also seen in ShinEtsu I036® hybrid resist under the same conditions.

Example 3

CoFe Plating with Hybrid Activation Energy Resist

A hybrid activation energy CARS (ShinEtsu I036®) was patterned by DUV at 248 nm wavelength. The exposed resist was contacted with a CoFe plating bath having a pH value of 3.0 for 30 minutes (please note the resist was not developed, and there was no plating; the immersion time in the plating solution is equivalent to the length of time required to plate 3 µm thick of CoFe). The resist thickness was 3.5 µm.

Figure 3:
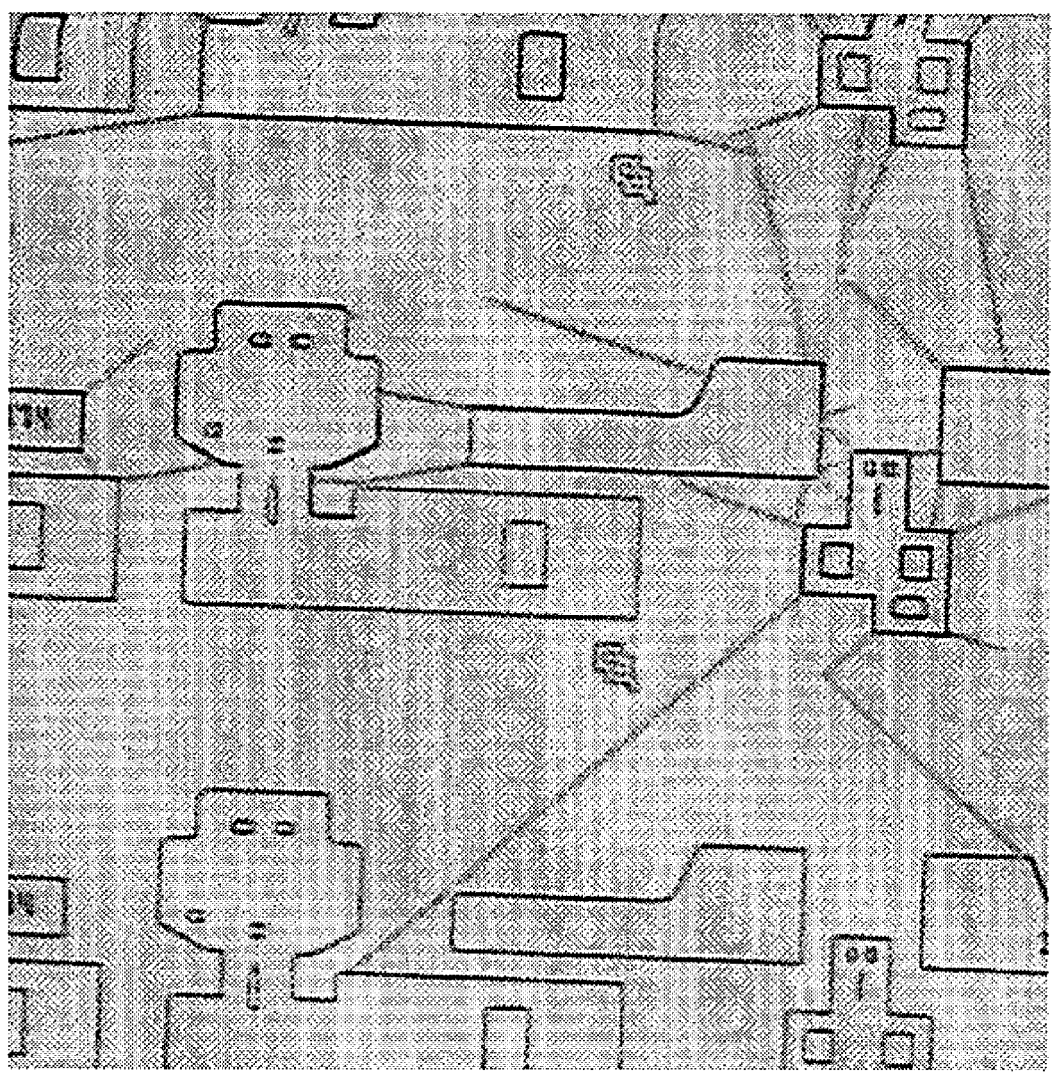
FIG. 3 shows fractures in ShinEtsu I036® resist (a hybrid resist containing low and high activation energy groups) at the edge of a wafer after immersion in CoFe plating bath as described in Example 3.

As shown in FIG. 3, the latent image was visible after exposure. Tensile stress in the resist induced by the plating solution resulted in cracks, especially between corners of the latent image.

Example 4

CoFeN Seedlayer/CoNiFe Plating

Plating of a magnetic write head pole formed by CoNiFe plating on a CoFeN seedlayer was performed. The resist used was a 3.5 μm thick layer of Shipley UV26®. Exposure of the write head pole pattern was performed using electron-beam lithography at 100 kV. The plating conditions were: 2 min $H_2/N_2$ pre-plate ash, plating solution pH=1.5, plating time 2 hrs, plating thickness=3 μm.

Following plating, no cracks, worms or under-plating were observed, indicating the UV26® resist was successfully applied and plated. Similar results were obtained using other high activation energy resists (e.g., TOK EP-TF 005 EL resist).

Example 5

Rh Seedlayer/CoFe Plating

Plating of a magnetic write head pole formed by CoFe plating on an Rh seedlayer was performed. The resist used was a 3.5 μm thick layer of UV26®. Exposure of the write head pole pattern was performed using electron-beam lithography at 100 kV. The plating conditions were: 2 min $H_2/N_2$ pre-plate ash, plating solution pH=3, plating time ~20 min.

Following plating, no cracks, worms or under-plating were observed, indicating the UV26® resist was successfully applied and plated. Similar results were obtained using other high activation energy resists (e.g., TOK EP-TF 005 EL resist).

Example 6

CoFeN Seedlayer/NiFe Plating

Plating of a magnetic write head pole formed by 22/78 NiFe plating on a CoFeN seedlayer was performed with PMGI (polydimethylglutarimide) underlayer. The resist used was a 3.5 μm thick layer of UV26®. Exposure of the write head pole pattern was performed using electron-beam lithography at 100 kV. The plating conditions were: 2 min $H_2/N_2$ pre-plate ash, plating solution pH=2.5, plating time ~30 min, plating thickness=3 μm.

Following plating, no cracks, worms or under-plating were observed, indicating the UV26® resist was successfully applied and plated. Similar results were obtained using other high activation energy resists (e.g., TOK EP-TF 005 EL resist).

All patents, publications, and other published documents mentioned or referred to herein are incorporated by reference in their entireties.

It is to be understood that while the invention has been described in conjunction with the certain specific embodiments thereof, that the foregoing description as well as the examples, are intended to illustrate and not limit the scope of the invention. It should be further understood by those skilled in the art that various changes may be made and equivalents may be substituted without departing from the scope of the invention, and further that other aspects, advantages and modifications will be apparent to those skilled in the art to which the invention pertains.

We claim:

1. A method of forming a component of a thin film magnetic head, wherein the magnetic head is formed from a structure that includes a substrate layer, a seedlayer deposited on the substrate layer, and a photoresist composition layer deposited on the seedlayer, comprising:

providing a high activation energy chemically amplified photoresist composition as said photoresist composition layer;

patternwise exposing said photoresist composition layer to an imaging radiation source to form a latent, patterned image in the photoresist composition layer;

developing the latent image in the photoresist composition layer with a developer to form a patterned photoresist; and, performing a plating process to form the thin film magnetic head component by directly contacting the patterned photoresist with a plating process solution having a pH of less than about 3.0, wherein the plated thin film magnetic head component is essentially free of plating defects.

2. The method according to claim 1, wherein the high activation energy chemically amplified photoresist has an activation temperature of at least about 70° C.

3. The method according to claim 2, wherein the high activation energy chemically amplified photoresist has an activation temperature of at least about 90° C.

4. The method according to claim 3, wherein the high activation energy chemically amplified photoresist has an activation temperature of at least about 120° C.

5. The method according to claim 1, wherein the high activation energy chemically amplified photoresist is a positive-tone photoresist.

6. The method according to claim 5, wherein the high activation energy chemically amplified photoresist contains an aqueous base soluble polymer resin having acid-cleavable substituent groups selected from acid-cleavable cyclic and branched aliphatic carbonyls, ester, oligomeric ester, ether, carbonate, orthoester, and a combination thereof.

7. The method according to claim 6, wherein the high activation energy chemically amplified photoresist contains an aqueous base soluble polymer resin having polar functional groups selected from hydroxyl, carboxyl, anhydride, lactone, imide, fluoroalcohol, sulfonamide, and a combination thereof.

8. The method according to claim 1, further comprising a post-exposure bake at a temperature of at least about 90° C.

9. The method according to claim 1, wherein the plating process solution comprises a high saturation magnetic moment plating material selected from NiFe, CoNiFe and CoFe.

10. The method according to claim 9, wherein the high saturation magnetic moment plating material has a saturation magnetic moment of at least about 2.4 T.

11. The method according to claim 1, wherein the plating process solution has a pH of less than about 2.5.

12. The method according to claim 1, wherein the plating process is a frame plating process.

13. A method of improving the plating of a component of a thin film magnetic head, comprising forming a frame plating patterned photoresist layer from a layer of a high activation energy chemically amplified photoresist composition coated on a substrate layer, and directly contacting the patterned photoresist layer with a plating process solution having a pH of less than about 3.0, wherein the plated thin film magnetic head component is essentially free of plating defects.

14. The method according to claim 13, wherein the high activation energy chemically amplified photoresist has an activation temperature of at least about 70° C.

15. The method according to claim 14, wherein the high activation energy chemically amplified photoresist has an activation temperature of at least about 90° C.

16. The method according to claim 15, wherein the high activation energy chemically amplified photoresist has an activation temperature of at least about 120° C.

17. The method according to claim 13, wherein the high activation energy chemically amplified photoresist is a positive-tone photoresist.

18. The method according to claim 17, wherein the high activation energy chemically amplified photoresist contains an aqueous base soluble polymer resin having acid-cleavable substituent groups selected from acid-cleavable cyclic and branched aliphatic carbonyls, ester, oligomeric ester, ether, carbonate, orthoester, and a combination thereof.

19. The method according to claim 18, wherein the high activation energy chemically amplified photoresist contains an aqueous base soluble polymer resin having polar functional groups selected from hydroxyl, carboxyl, anhydride, lactone, imide, fluoroalcohol, sulfonamide, and a combination thereof.

20. The method according to claim 13, wherein the plating process solution comprises a high saturation magnetic moment plating material selected from NiFe, CoNiFe and CoFe.

21. The method according to claim 20, wherein the high saturation magnetic moment plating material has a saturation magnetic moment of at least about 2.4 T.

22. The method according to claim 13, wherein the plating process solution has a pH of less than about 2.5.

23. In a method of plating a component of a thin film magnetic head, wherein a photoresist composition is layered on a substrate layer, formed into a patterned photoresist composition layer and directly contacted with a plating process solution having a pH of less than about 3.0 in order to form a component of the thin film magnetic head, the improvement which comprises employing a high activation energy chemically amplified photoresist composition as said photoresist composition such that the plated thin film magnetic head component is essentially free of plating defects arising from contact of the photoresist composition layer with the plating process solution.

24. The method according to claim 23, wherein the high activation energy chemically amplified photoresist is a positive-tone photoresist having an activation temperature of at least about 90° C.

25. The method according to claim 24, wherein the high activation energy chemically amplified photoresist contains an aqueous base soluble polymer resin having acid-cleavable substituent groups selected from acid-cleavable cyclic and branched aliphatic carbonyls, ester, oligomeric ester, ether, carbonate, orthoester, and a combination thereof.

26. The method according to claim 23, wherein the plating process solution comprises a high saturation magnetic moment plating material having a saturation magnetic moment of at least about 2.4 T selected from NiFe, CoNiFe and CoFe.

27. A frame plating method, comprising:
    forming a pattern in a photoresist composition comprising a high activation energy chemically amplified photoresist, or in a layer of said photoresist composition formed on a substrate, by patternwise exposing said photoresist composition to an imaging radiation source to form a latent, patterned image in the photoresist composition;
    developing the latent image in the photoresist composition with a developer to form a patterned photoresist;
    performing a plating process using the patterned photoresist as a frame by directly contacting the patterned photoresist with a plating process solution having a pH of less than about 3.0, and
    removing the patterned photoresist.

28. The method according to claim 27, wherein the high activation energy chemically amplified photoresist is a positive-tone photoresist having an activation temperature of at least about 90° C.

29. The method according to claim 28, wherein the high activation energy chemically amplified photoresist contains an aqueous base soluble polymer resin having acid-cleavable substituent groups selected from acid-cleavable cyclic and branched aliphatic carbonyls, ester, oligomeric ester, ether, carbonate, orthoester, and a combination thereof.

30. The method according to claim 27, wherein the plating process solution comprises a high saturation magnetic moment plating material having a saturation magnetic moment of at least about 2.4 T selected from NiFe, CoNiFe and CoFe.

* * * * *